United States Patent
Kasai et al.

(10) Patent No.: US 7,569,413 B2
(45) Date of Patent: Aug. 4, 2009

(54) METHOD OF FORMING THIN FILM STRUCTURE WITH TENSILE AND COMPRESSED POLYSILICON LAYERS

(75) Inventors: Takashi Kasai, Nara (JP); Shuichi Wakabayashi, Nara (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 11/703,444

(22) Filed: Feb. 7, 2007

(65) Prior Publication Data

US 2007/0196946 A1 Aug. 23, 2007

(30) Foreign Application Priority Data

Feb. 22, 2006 (JP) .............................. 2006-044870

(51) Int. Cl.
*H01L 21/00* (2006.01)
*H01L 21/425* (2006.01)
(52) U.S. Cl. .................. 438/53; 438/530; 257/E29.324
(58) Field of Classification Search ............. 438/50–53, 438/514, 542, 449, 510, 530; 257/415–420, 257/E29.324
See application file for complete search history.

(56) References Cited

U.S. PATENT DOCUMENTS

| | | | |
|---|---|---|---|
| 4,672,849 A * | 6/1987 | Hoshino ..................... 73/579 |
| 5,753,134 A | 5/1998 | Biebl |
| 6,174,820 B1 * | 1/2001 | Habermehl et al. ......... 438/745 |
| 6,268,068 B1 | 7/2001 | Heuer et al. |
| 6,610,361 B1 * | 8/2003 | Heuer et al. ........... 427/255.18 |
| 6,967,757 B1 * | 11/2005 | Allen et al. .................. 359/224 |
| 7,370,940 B2 * | 5/2008 | Hashimoto .................... 347/54 |
| 2002/0186444 A1 * | 12/2002 | Koester ....................... 359/223 |
| 2003/0099737 A1 * | 5/2003 | Eldridge et al. ............. 425/385 |
| 2006/0066932 A1 * | 3/2006 | Chui et al. ................... 359/247 |
| 2006/0205192 A1 * | 9/2006 | Walther et al. .............. 438/513 |
| 2007/0121972 A1 * | 5/2007 | Suzuki et al. ................ 381/174 |

* cited by examiner

*Primary Examiner*—Hsien-ming Lee
*Assistant Examiner*—Kevin Parendo
(74) *Attorney, Agent, or Firm*—Osha • Liang LLP

(57) ABSTRACT

A method for forming a thin film structure, which has small tensile stress due to controlled mechanical stress, and is made to be conductive, is provided. A lower film including polysilicon thin film is formed on a substrate such as Si substrate, then an impurity such as P is doped into the lower film and thermally diffused, thereby the lower film is made conductive. Then, an upper film is deposited on the lower film, the upper film including a polysilicon thin film that is simply deposited and not made to be conductive. The upper film has a tensile stress in an approximately the same level as compressive stress of the lower film, and a thin film structure as a whole, the structure including the lower film and the upper film, is adjusted to have small tensile stress.

2 Claims, 19 Drawing Sheets

METHOD OF FORMING THIN FILM STRUCTURE WITH TENSILE AND COMPRESSED POLYSILICON LAYERS

BACKGROUND OF THE INVENTION

1. Field of the Invention

The present invention relates to a method for forming thin film structure and a thin film structure, an oscillation sensor, a pressure sensor, and an acceleration sensor. In particular, the invention relates to a method for forming a thin film structure including a plurality of polysilicon thin films combined to one another, a thin film structure formed by the relevant method, an oscillation sensor, a pressure sensor, and an acceleration sensor each having the relevant thin film structure in a sensing section.

2. Description of Related Art

In some oscillation sensors, acceleration sensors, or gyro sensors, a polysilicon thin film is used in a sensing section, and in such sensors, the periphery of the polysilicon thin film is held by a substrate so that the polysilicon thin film forms a three-dimensional structure. The polysilicon thin film for such application must be electrically conductive since an electric signal needs to be drawn to the outside. As a method of making the polysilicon thin film to be conductive, a method is typically used, in which an impurity is doped and diffused into the polysilicon thin film.

However, when the polysilicon thin film is doped with an impurity to be conductive, such conducting treatment induces compressive stress within the polysilicon thin film, causing troubles in various sensors. For example, a polysilicon thin film being made conductive is used as an oscillation film in oscillatory type sensors such as oscillation sensor (microphone) or gyro sensor, however, in the oscillator type sensors, internal stress in the polysilicon thin film significantly affects oscillation characteristics, and affects sensor accuracy. In particular, when compressive stress is induced in the polysilicon thin film, the oscillation film may be buckled and therefore not oscillated at all. In capacitance type sensors such as acceleration sensor (comblike acceleration sensor), when compressive stress is induced in the polysilicon thin film, the polysilicon thin film may be warped or buckled by an effect of the compressive stress, consequently change in capacitance of the sensing section occurs, which largely affects sensor accuracy.

In this way, while the polysilicon thin film to be used for sensing needs to be conductive for drawing the electric signal, when the film is doped with an impurity to be conductive, compressive stress is induced in the polysilicon thin film through heat treatment after impurity doping, and the compressive stress adversely affects sensor accuracy. Conversely, when tensile stress is intended to be kept in the polysilicon thin film, the polysilicon thin film is hardly made to be conductive. That is, there have been conflicting difficulties.

Thus, in an invention disclosed in U.S. Pat. No. 5,753,134 (JP-A-7-211709), as shown in FIG. 1, a thin film structure, in which a plurality of polysilicon thin films 13, 15, 17 and 19 deposited at the same condition and auxiliary layers 14, 16 and 18 are combined with each other, is formed on a substrate 11 via a sacrifice layer 12, and a thin film structure having small stress is designed to be achieved by combining the polysilicon thin films 13, 15, 17 and 19 with the auxiliary layers 14, 16 and 18.

However, such a thin film structure has not been able to obtain compatibility between processes of control of stress induced within the structure, and reduction in electric resistance. In the method described in U.S. Pat. No. 5,753,134 (JP-A-7-211709), an impurity is implanted after precipitation of corresponding partial layers respectively, or implanted after completion of the entire thin film structure in order to decrease the electric resistance of the thin film structure, however, optional tensile stress has not been able to be obtained in such a method. The reason for this is that since an impurity such as phosphor (P) works as a compression source, compression stress is induced in a film doped with the impurity, consequently small tensile stress can not be achieved (refer to Control of Residual Stress of Polysilicon Thin Films by Heavy Doping in Surface Micromaching; M. Orpana and A. O. Korhonen; Proceeding International Conference Solid-State Sensors & Actuators (Transducers '91), San Francisco, Calif., 1991 (IEEE, New York, 1991) pp. 957-960). Moreover, in such a thin film structure, diffusion of the impurity may not proceed by being hindered by the auxiliary layers 14, 16 and 18, or change in stress in the polysilicon thin films 13, 15, 17 and 19 may be increased in an impurity diffusion process, consequently stress has been hardly controlled.

As another method, a method as disclosed in U.S. Pat. No. 6,268,068 is proposed. In the method, as shown in FIG. 2, multilayer polysilicon thin films 22 to 27 are stacked on a substrate 21. By using a fact that a polysilicon thin film deposited by a LPCVD process may be a source of either compressive stress or tensile stress by changing a deposition condition, temperature during deposition is changed for each of the polysilicon thin films 22 to 27, thereby thin films having compressive stress and thin films having tensile stress are formed, and a thin film structure having small stress is designed to be achieved by appropriately combining the thin films with each other.

However, since the polysilicon thin film has an increased resistance value if an impurity is not thermally diffused after the impurity is doped, the thin film structure fabricated by such a method has a high resistance value, and therefore has not been able to be used for a sensing device from which an electric signal needs to be drawn. That is, in the method as in U.S. Pat. No. 6,268,068, the auxiliary layer such as natural oxide film is not present between a polysilicon thin film having tensile stress and a polysilicon thin film having compressive stress, and respective layers of the polysilicon thin films are continuously deposited. Therefore, the polysilicon films can not be subjected to conducting treatment during depositing the respective layers of the polysilicon thin films, consequently the thin film structure has not been able to be made to be conductive. Again in the method, stress in the polysilicon thin films has been hardly controlled, therefore a thin film structure having small tensile stress has been hardly obtained.

Patent literature 1: U.S. Pat. No. 5,753,134 (JP-A-7-211709)

Patent literature 2: U.S. Pat. No. 6,268,068

Non-patent literature 1: Control of Residual Stress of Polysilicon Thin Films by Heavy Doping in Surface Micromaching; M. Orpana and A. O. Korhonen; Proceeding International Conference Solid-State Sensors & Actuators (Transducers '91), San Francisco, Calif., 1991 (IEEE, New York, 1991) pp. 957-960

SUMMARY OF THE INVENTION

An embodiment of the invention, which was made in the light of technical difficulties as described above, aims to provide a method for forming a thin film structure that has small tensile stress due to controlled mechanical stress, and is made to be conductive.

A method for forming a thin film structure according to an embodiment of the invention, which is for forming a thin film structure including a lower film and an upper film on a substrate, includes a step of forming a lower film including a polysilicon thin film on a substrate, a step of making the lower film to be conductive by doping an impurity into the lower film and thermally diffusing the impurity, and a step of forming an upper film including a polysilicon thin film on the lower film, the upper film being not made to be conductive and having a tensile stress in approximately the same level as compressive stress of the lower film.

According to an embodiment of the invention, since the lower film is made to be conductive by doping an impurity into the lower film and thermally diffusing the impurity, the thin film structure including the lower film and the upper film can be made conductive, and an electric signal for detecting deformation or the like of the thin film structure can be drawn from the thin film structure.

On the other hand, since the upper film is not made to be conductive, the film need not be subjected to heat treatment to be made conductive, in addition, since the upper film is deposited on the lower film after the lower film was subjected to conducting treatment, the upper film is not subjected to heat treatment when the lower film is made conductive. Accordingly, while compressive stress (film stress) is induced in the lower film through heat treatment to make the film conductive, compressive stress is not induced and tensile stress is kept in the upper film. Then, stress is controlled such that tensile stress of the upper film is approximately in the same level as compressive stress of the lower film, thereby stress in the thin film structure as a whole can be decreased. As a result, the thin film structure formed by the method of an embodiment of the invention is hardly deformed by buckling or the like caused by compressive stress, or when it is used for a sensing device, measurement accuracy can be improved.

Therefore, according to an embodiment of the invention, compatibility between excellent control of internal stress in a thin film structure, and a thin film structure being made to be conductive can be achieved.

In one embodiment of a method for forming a thin film structure according to an embodiment of the invention, the thin film structure as a whole is controlled to have tensile stress. According to such an embodiment, since the thin film structure has small tensile stress, the thin film structure is in a tensioned state, and therefore the thin film structure is not buckled, and easily deformed by external force.

In another embodiment of a method for forming a thin film structure according to an embodiment of the invention, after an impurity is doped into the lower film, an anti-defect film is formed on a top of the lower film before the impurity is thermally diffused. According to such an embodiment, crystal defects can be prevented from being induced in a surface layer of the lower film during heat treatment.

In still another embodiment of a method for forming a thin film structure according to an embodiment of the invention, after the upper film is formed on the anti-defect film, part of the upper film is removed by etching with the anti-defect film as an etching stop layer, thereby part of the lower film is electrically exposed from the upper film. Here, "electrically expose" refers to a case that part of the lower film is directly exposed from a removed portion of the upper film, and a case that part of the lower film is covered with a conductive material in the removed portion of the upper film. According to such an embodiment, since the upper film being not conductive is removed by etching, thereby the lower film is electrically exposed, the lower film can be easily connected to an external circuit or the like. Moreover, since the upper film is removed by etching with the anti-defect film as the etching stop layer, only the upper film can be etched easily and accurately compared with a case that the upper film is etched in a time control manner.

In still another embodiment of a method for forming a thin film structure according to an embodiment of the invention, after the impurity is thermally diffused, the anti-defect film is removed by etching with part of the film being left, then the upper film is formed on the lower film over the anti-defect film, and then part of the upper film is removed by etching with the anti-defect film as an etching stop layer, thereby part of the lower film is electrically exposed from the upper film. Here, "electrically expose" refers to a case that part of the lower film is directly exposed from a removed portion of the upper film, and a case that part of the lower film is covered with a conductive material in the removed portion of the upper film. According to such an embodiment, since the upper film being not conductive is removed by etching, thereby the lower film is electrically exposed, the lower film can be easily connected to an external circuit or the like. Moreover, since the upper film is removed by etching with the anti-defect film as the etching stop layer, only the upper film can be etched easily and accurately compared with a case that the upper film is etched in a time control manner.

In still another embodiment of a method for forming a thin film structure according to an embodiment of the invention, before or after the lower film is formed, an electric wiring section to be electrically conducted to the lower film is previously formed on the substrate after the lower film was made to be conductive, then the upper film is formed on the electric wiring section, and then the electric wiring section is exposed from the upper film. According to such an embodiment, the lower film can be connected to an external circuit through the electric wiring section.

A thin film structure fabricated by the method for forming the thin film structure according to an embodiment of the invention can be used for a sensing section of an oscillation sensor, a pressure sensor, and an acceleration sensor, and can improve measurement accuracy of the sensors.

Components of an embodiment of the invention as described above can be optionally combined as long as possible.

DESCRIPTION OF THE PREFERRED EMBODIMENT

Hereinafter, examples of the invention will be described in detail according to drawings.

Example 1

Figure 1:
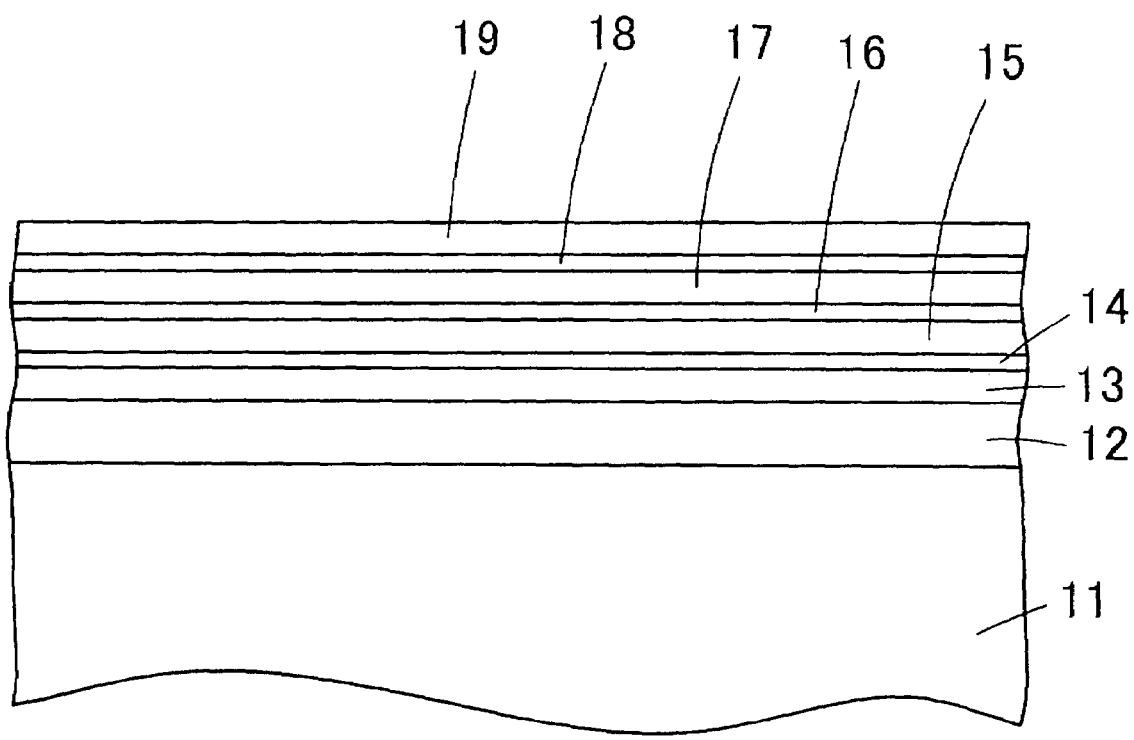
FIG. 1 is a schematic view for illustrating a usual example.
Figure 2:
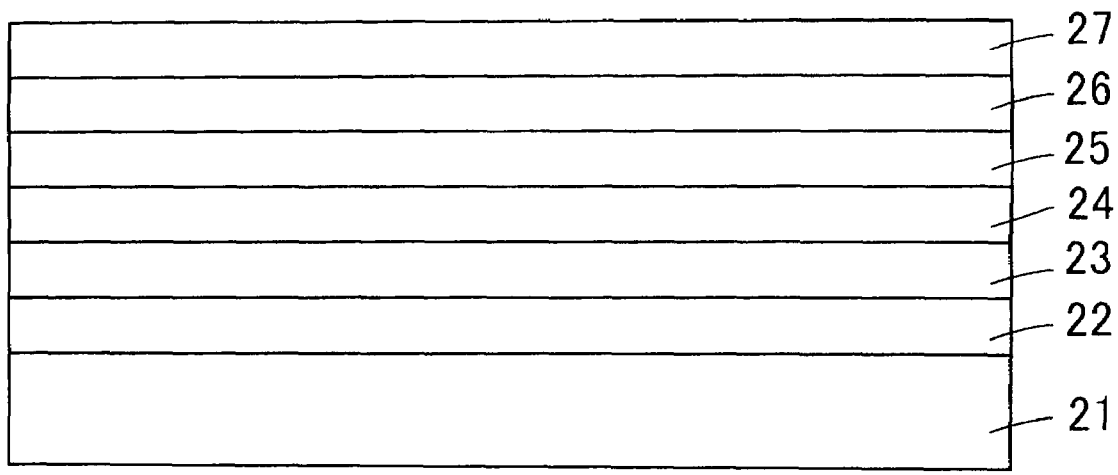
FIG. 2 is a schematic view for illustrating another usual example.
Figure 3:
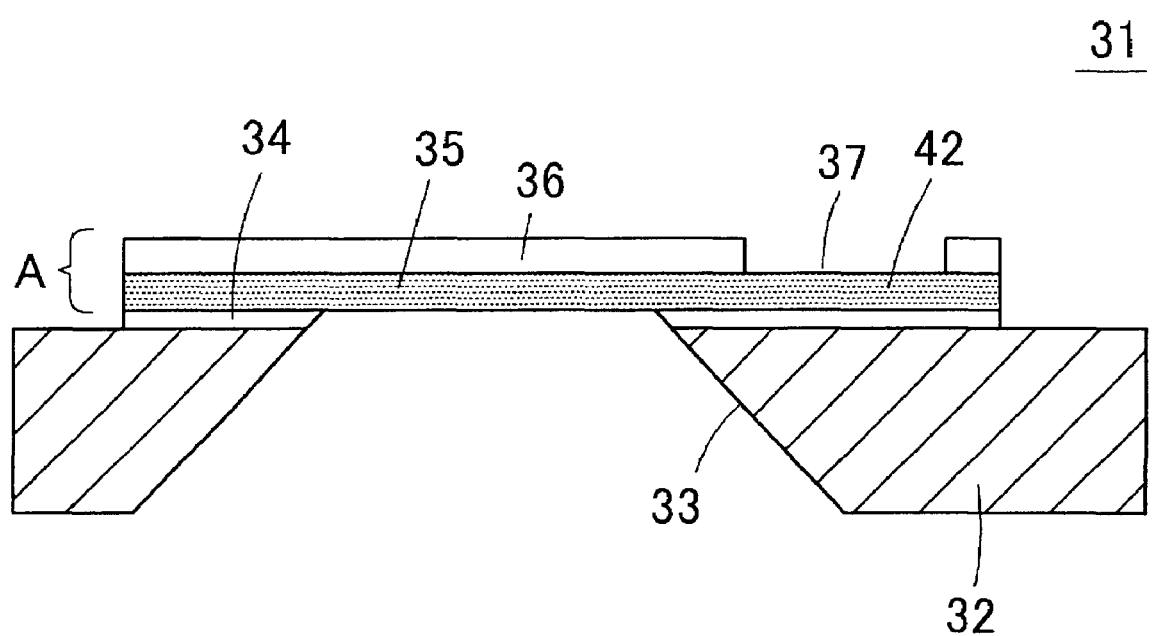
FIG. 3 is a schematic section view showing a sensing device according to example 1 of the invention.

FIG. 3 is a schematic section view showing example 1 of the invention, which shows a sensing device 31 having a thin film structure A according to an embodiment of the invention. In the example 1, the thin film structure A is formed on a top of a substrate 32. The substrate 32 includes a semiconductor substrate such as Si substrate, metal substrate, or ceramic substrate, and has a through-hole 33 being vertically penetrated. A thin insulating film 34 including oxide or nitride is formed on a top of the substrate 32, and the thin film structure A is provided on a top of the insulating film 34. The thin film structure A is formed by stacking an upper film 36 on a top of a lower film 35, and stacked on the insulating film 34 on the substrate 32 at a peripheral portion and covers a top of the through-hole 33 of the substrate 32.

The lower film 35 configuring the thin film structure A includes a polysilicon (polycrystalline Si) thin film, and made to be electrically conductive by doping an impurity into the polysilicon thin film and thermally diffusing the impurity. Although the upper film 36 also includes a polysilicon thin film, the upper film 36 is a simply deposited film, and not doped with an impurity. Since the upper film 36 is a simply deposited polysilicon thin film, it is not conductive. Moreover, in the thin film structure A, the upper film 36 is partially opened outside a region opposed to the through-hole 33, and the conductive lower film 35 is exposed from the relevant opening 37 to form an electrode leading portion 42, so that the lower film 35 can be connected to an external electric circuit or the like.

While a simply deposited polysilicon thin film is not conductive, and has internal stress being tensile stress, when an impurity is doped into the film and thermally diffused in order to make the film to be conductive, the internal stress in the polysilicon thin film becomes compressive stress due to high temperature during thermal diffusion. Therefore, while the lower film 35 is conductive, it has compressive stress. On the contrary, while the upper film 36 is not conductive, it has tensile stress.

When the thin film structure A used in a sensing section of the sensing device has a large compressive stress, there is concern for a phenomenon that the structure A may be hard to be sensibly deformed in response to external force, leading to fluctuation in measurement accuracy or properties, or measurement is disabled due to buckling of the thin film structure A. Therefore, in an embodiment of the invention, the lower film 35 having compressive stress and the upper film 36 having tensile stress are combined, and controlled such that the tensile stress of the upper film 36 and the compressive stress of the lower film 35 are in approximately the same level, so that stress in the conductive thin film structure A is reduced. Preferably, it is designed that stress of the thin film structure A as a whole is small tensile stress, or substantially zero. However, generally, it is enough that a level of the tensile stress corresponds to a level of tensile stress to be required for the sensing section of the sensing device. In the case of considering the oscillation sensor, pressure sensor and the like, since too large tensile stress may cause reduction in sensitivity, it is desirable that small tensile stress is totally obtained, and it is particularly desirable that tensile stress being approximately 0 MPa is obtained.

Accordingly, according to such a configuration, a thin film structure A that is conductive and totally has tensile stress can be fabricated, so that a thin film structure A being preferably used for the sensing section of the sensing device 31 can be obtained.

Figure 4A:
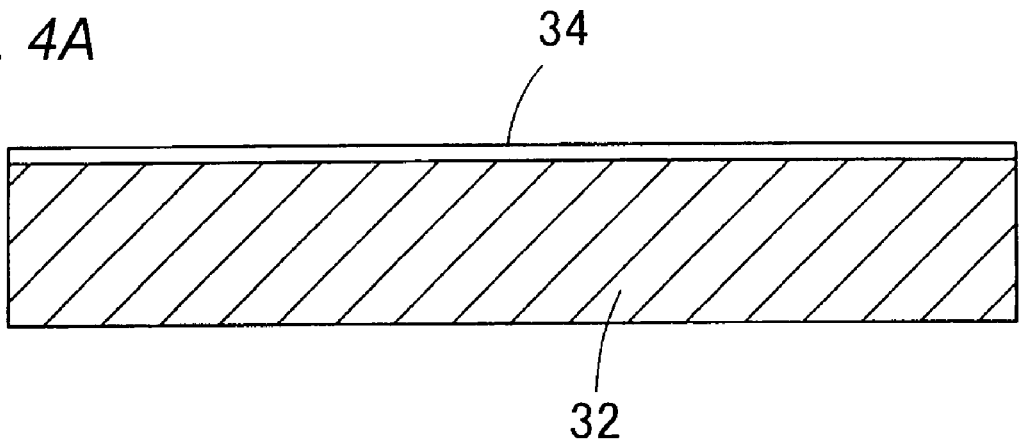
FIGS. 4A to 4C are schematic section views for illustrating a manufacturing process of the sensing device according to the example 1.
Figure 4B:
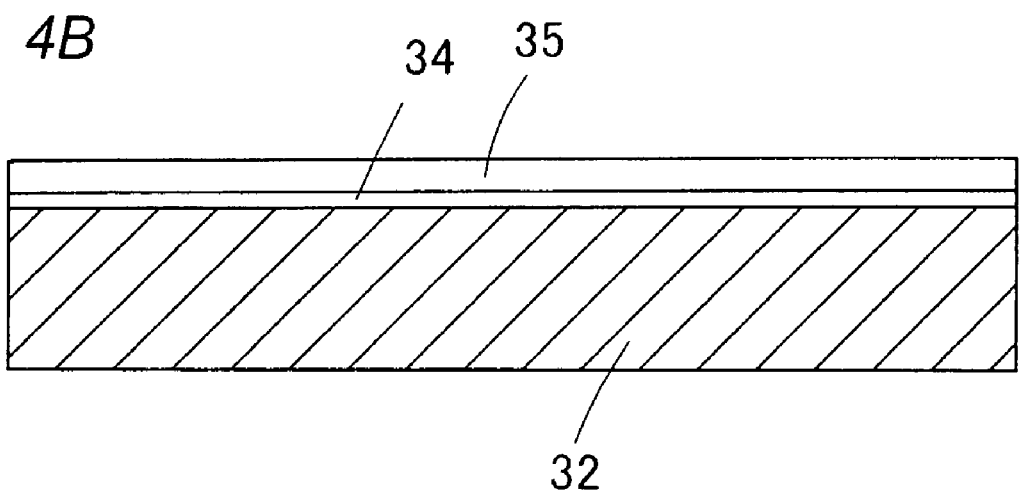

Next, an example of a manufacturing method for manufacturing the thin film structure A having the configuration as above is described according to FIGS. 4A to 4C, FIGS. 5A to 5C, and FIGS. 6A and 6B. A Si substrate is used for the substrate 32. First, the insulating film 34 including a $SiO_2$ film or SiN film is formed on the top of the substrate 32 by a common procedure (FIG. 4A). While a film is also formed on a back in some deposition methods, it is omitted in the figure. (This is the same in the following.) Then, polysilicon is deposited on the top of the insulating film 34 to form the lower film 35 (FIG. 4B). While a deposition condition of the lower film 35 is not significantly limited, deposition is desirably controlled such that a small compressive stress is induced in the lower film 35 after the film was subjected to steps of impurity doping and thermal diffusion of the impurity. Typically, it is enough that the lower film 35 is deposited by a LPCVD process (Low-Pressure Chemical Vapor Deposition process). Since a thin film is reduced in deposition rate with decrease in deposition temperature, resulting in reduction in productivity, it is desirable that the lower film 35 is deposited at a somewhat high temperature (580° C. or more) to improve productivity. Specifically, the lower film 35 is deposited by the LPCVD process using $SiH_4$ as a source gas at a condition of temperature of 620° C. and pressure of 300 mTorr.

Figure 4C:
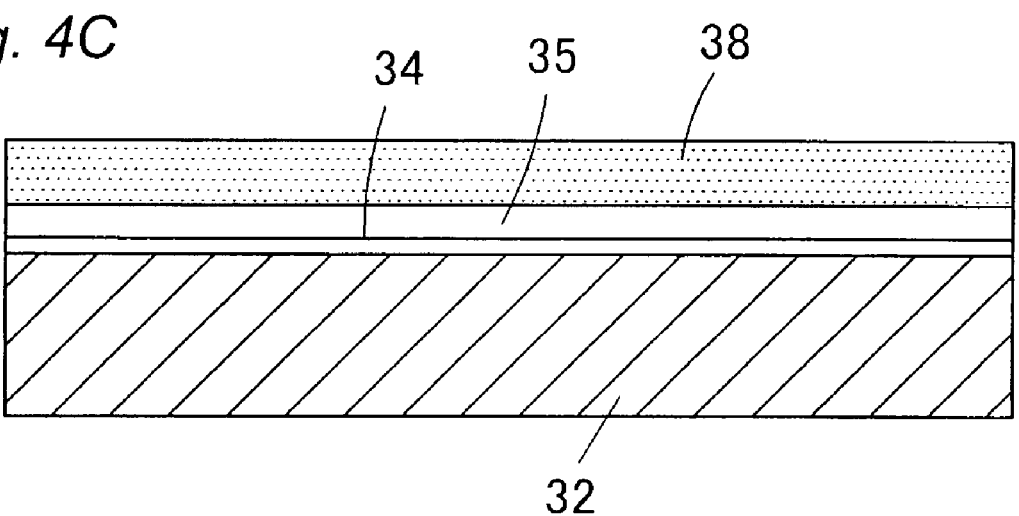
Figure 5A:
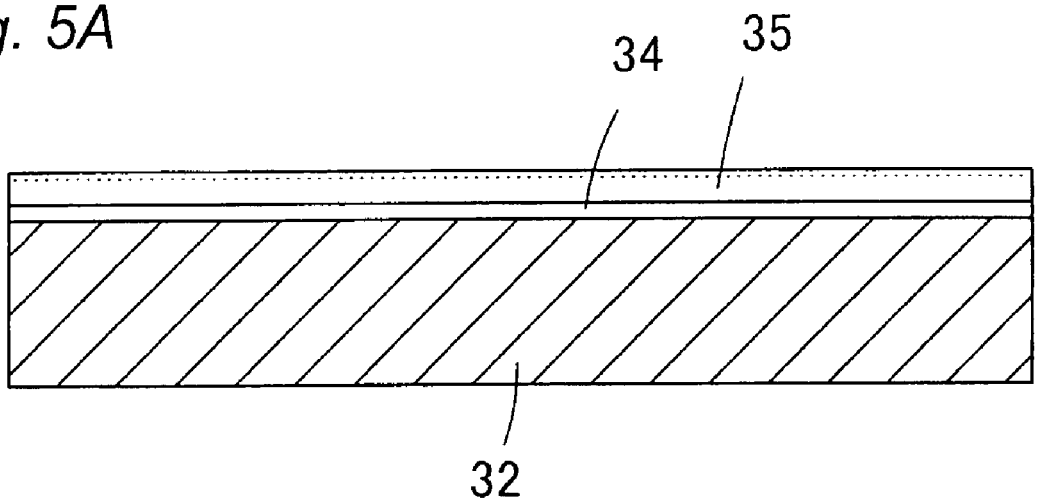
FIGS. 5A to 5C are schematic section views for illustrating the manufacturing process of the sensing device according to the example 1, showing steps after FIG. 4C.

Next, P (phosphorous), B (boron) or the like is ion-implanted into the lower film 35, or an impurity source such as PSG, BSG or $POCl_3$ is deposited on the lower film 35, thereby an impurity such as P or B is doped into the lower film 35. Specifically, as shown in FIG. 4C, phosphorous glass (PSG) was deposited as an impurity source 38 on the top of the lower film 35, then the lower film 35 was heated for 15 min at a temperature of 950° C. in an atmosphere of a mixed gas of $PH_3$ and $O_2$, so that P ions were doped into a surface portion of the lower film 35. Then, the impurity source 38 (phosphorous glass) was dipped in a hydrofluoric acid solution and thus removed (FIG. 5A).

Figure 5B:
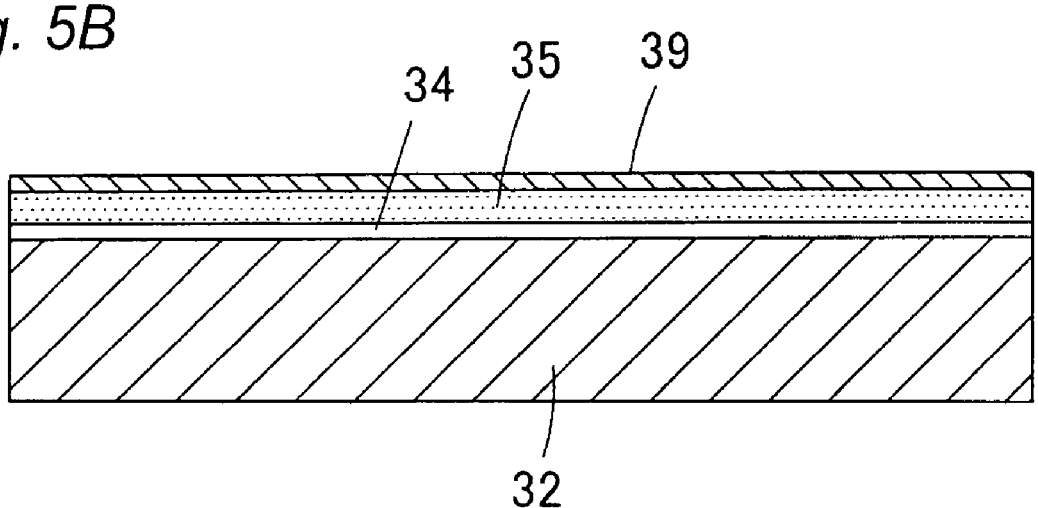

Next, an anti-defect film 39 is formed on the top of the lower film 35 after the impurity source 38 was removed (FIG. 5B). A method of forming the anti-defect film 39 is as follows, the substrate 32 having the lower film 35 formed thereon is placed in a heating chamber such as furnace or rapid thermal anneal equipment, then $O_2$ gas is (flown into the heating chamber to form an oxide film on a surface of the lower film 35, and the oxide film is used as the anti-defect film 39. Specifically, a $SiO_2$ film 700 Å in thickness was formed. Then, the lower film 35 is heated as it is in the heating chamber for heat treatment, thereby the impurity such as P, which has been doped in the surface of the lower film 35, is diffused into the lower film 35 (FIG. 5B). Specifically, the substrate 32 was placed in the furnace, and subjected to heat treatment for 2 hours at a temperature of 1100° C. in a $N_2$ gas atmosphere. The heat treatment (anneal) gives advantages that the impurity is thermally diffused in the lower film 35 to make the lower film 35 to be conductive, and crystal defects and the like induced in the lower film 35 through impurity doping are removed. Moreover, the surface of the lower film 35 is covered with the anti-defect film 39 during heat treatment, thereby the impurity is prevented from escaping from the lower film 35 by vaporization, and crystal defects are prevented from being induced in the lower film 35 during heat treatment.

While the lower film 35 has tensile stress during deposition, it is subjected to heat treatment at a high temperature of more than 1000° C., as a result, an absolute value of internal stress in the lower film 35 is gradually decreased, and eventually changed to compressive stress. Therefore, the heat treatment is desirably controlled such that the lower film 35 is made sufficiently conductive, and has small compressive stress to the utmost. The anti-defect film 39 may not be formed.

When heat treatment is completed, the substrate 32 is taken out from the heating chamber, and the anti-defect film 39 is removed using a hydrofluoric acid solution or the like. However, since such treatment is performed in air, even if the impurity source 38 is removed by the hydrofluoric acid solution or the like, an extremely small amount (maximum thickness of approximately 50 Å) of natural oxide film exists on the surface of the lower film 35.

Figure 5C:
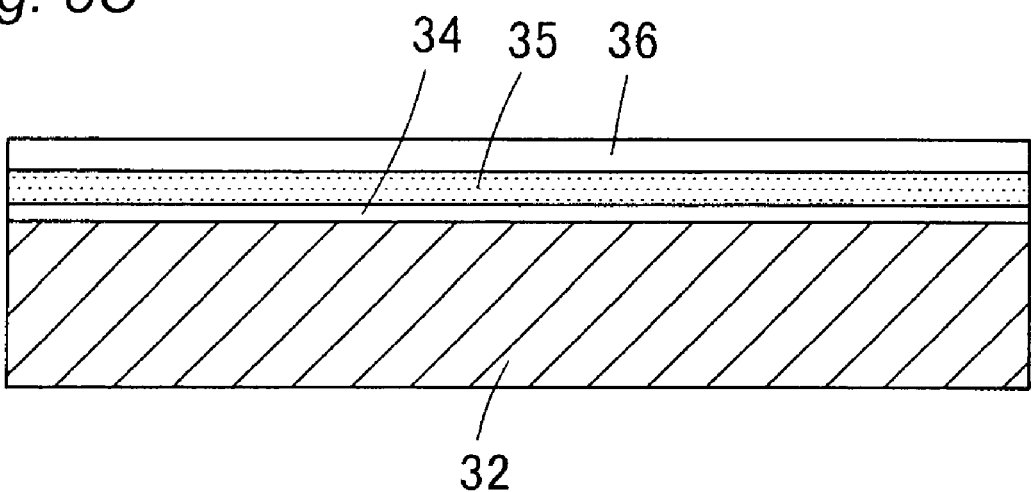

Next, the upper film 36 including a polysilicon thin film is deposited on the top of the lower film 35 at a condition that a stress value is a tensile stress value (FIG. 5C). To allow a simply deposited, upper film 36 to have tensile stress, it is enough that polysilicon is deposited in an amorphous state, and the film is made to be polycrystalline after deposition. Among conditions of the deposition, temperature during deposition is most effective, and deposition temperature can be 570° C. to 620° C. Specifically, the upper film 36 was deposited by the LPCVD process at a temperature of 580° C. and pressure of 300 mTorr in an atmosphere of $SiH_4$ gas.

Moreover, the thin film structure A, which was obtained by depositing the upper film 36 on the top of the lower film 35, is desirably adjusted such that the structure as a whole has small tensile stress. For this purpose, it can be designed that tensile strength of the upper film 36 is approximately the same as compressive stress of the lower film 35, or slightly larger than compressive stress of the lower film 35. If a value of stress or thickness of the lower film 35 has been measured before depositing the upper film 36, stress of the upper film 36 can be adjusted depending on the value. For example, when a value of compressive stress (absolute value) of the lower film 35 is larger than a target value, tensile stress is increased by increasing thickness of the upper film 36, thereby a stress value as a whole can be controlled to be a target value. As a method of measuring stress of the lower film 35, for example, the stress can be measured by measuring warp of the substrate 32 or the like.

The upper film 36 may be not only the simply deposited film (AsDepo film), but also subjected to heat treatment unless temperature is excessively high so that stress is relieved. However, since a high temperature of 1000° C. or more induces compressive stress in the upper film 36 because the impurity in the lower film 35 is diffused into the upper film, the upper film 36 must be avoided to be subjected to heat treatment at a temperature of 1000° C. or more.

Figure 6A:
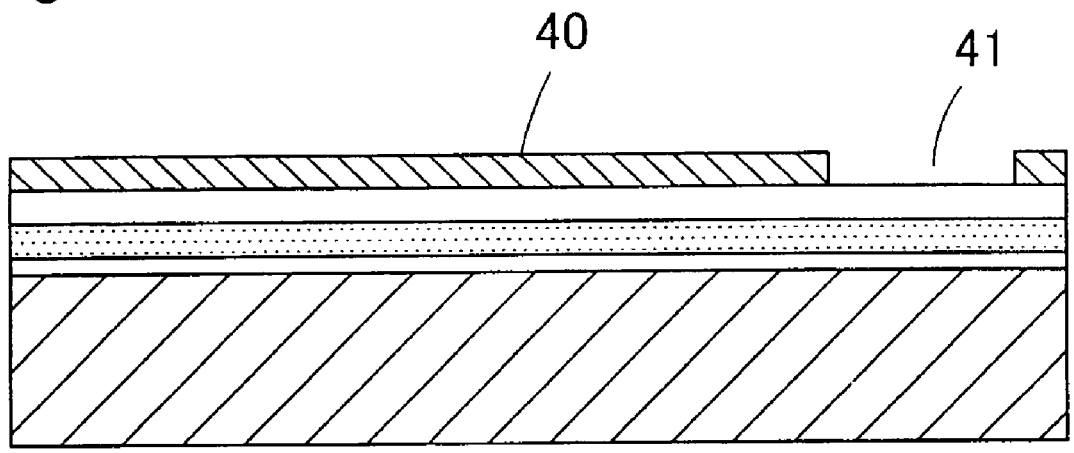
FIGS. 6A and 6B are schematic section views for illustrating the manufacturing process of the sensing device according to the example 1, showing steps after FIG. 5C.
Figure 6B:
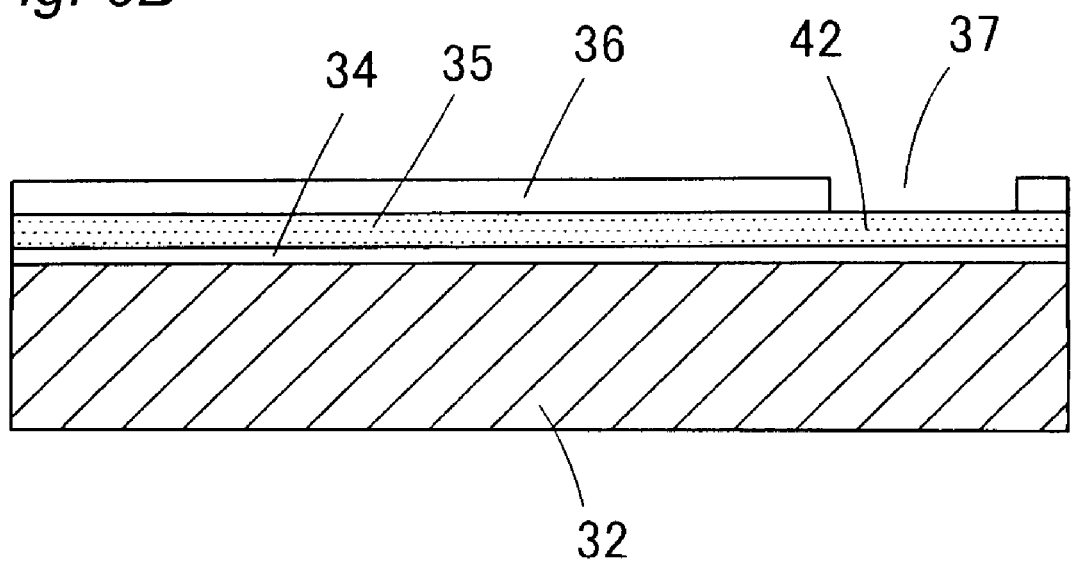

Next, photoresist is coated on the top of the upper film 36 to form a resist mask 40, then a opening area 41 is opened in the resist mask 40 in a region to be an electrode leading portion 42 (FIG. 6A), and then only the upper film 36 is removed by etching through the opening area 41 of the resist mask 40, so that an opening 37 is opened in the upper film 36 with being opposed to the opening area 41. To etch only the upper film 36 with the lower film 35 being not etched, for example, a method is given, in which etching is performed while controlling etching time in dry or wet etching. For example, a dry etching (Reactive Ion Etching) process is used for an etching method of the upper film 36, and it is enough that positive resist is used for the resist mask 40, and etching is performed by plasma of a mixed gas of $SF_6$ and $O_2$. Alternatively, when wet etching is performed, it is enough that a silicon oxide film or a silicon nitride film is used for the resist mask 40, and the upper film 36 is etched by TMAH, KOH or the like. When the resist mask 40 is separated from the top of the upper film 36, the lower film 35 is exposed in the opening 37 of the upper film 36, thereby the electrode leading portion 42 is formed (FIG. 6B).

Then, when the substrate 32 is etched from a bottom side to open the through-hole 33 in the substrate 32, and furthermore unnecessary portions of the insulating film 34, lower film 35, upper film 36 and the like are removed by etching, the sensing device 31 as shown in FIG. 3 is obtained. If the insulating film 34 is not present between the substrate 32 and the lower film 35, when the unnecessary portions of the lower film 35 and upper film 36 including polysilicon are removed by etching, the substrate 32 including silicon may be damaged by etching. However, in the example 1, since the insulating film 34 including oxide film or nitride film is formed between the substrate 32 and the lower film 35, if the unnecessary portions of the upper film 36 and lower film 35 are selectively removed by etching using an etchant that etches polysilicon but does not etch the insulating film 34, then an unnecessary portion of the insulating film 34 is selectively etched using an etchant that etches the insulating film 34 but does not etch silicon, the unnecessary portions of the upper film 36 and the like can be removed without damaging the substrate 32.

In the electrode leading portion 42, a wire bonding pad including a metal material such as Au or Al may be formed on the lower film 35 by a known method.

Example 2

Figure 7:
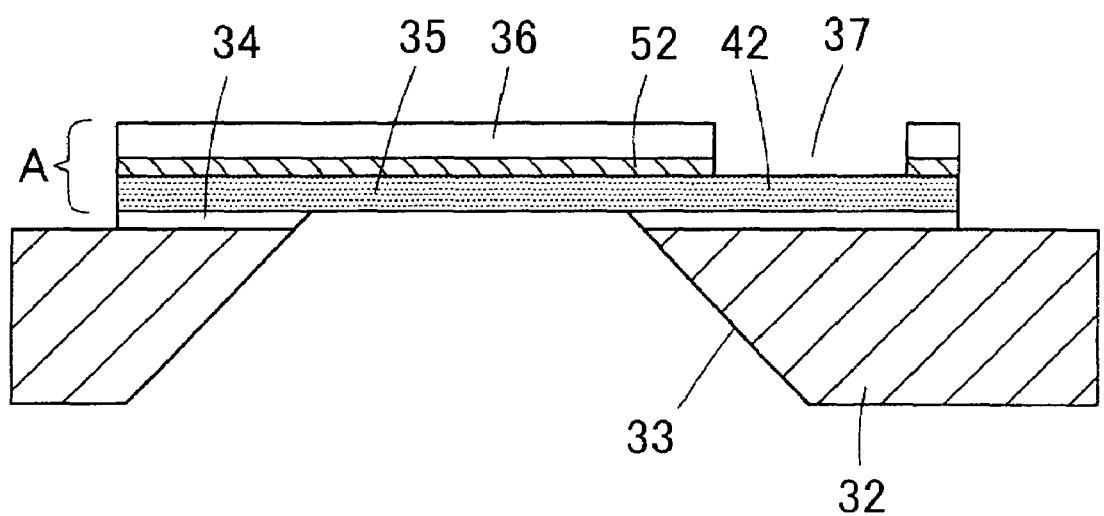
FIG. 7 is a schematic section view showing a sensing device according to example 2 of the invention.

FIG. 7 is a schematic section view showing example 2 of the invention, which shows a sensing device 51 having a thin film structure A according to an embodiment of the invention. The sensing device 51 of the example 2 is different from the example 1 in that an etching stop layer 52 is provided between the lower film 35 and the upper film 36. According to the example 2, since the etching stop layer 52 is provided, when the opening 37 is opened in the upper film 36, only the upper film 36 can be etched accurately compared with a case that etching time is controlled.

Figure 8A:
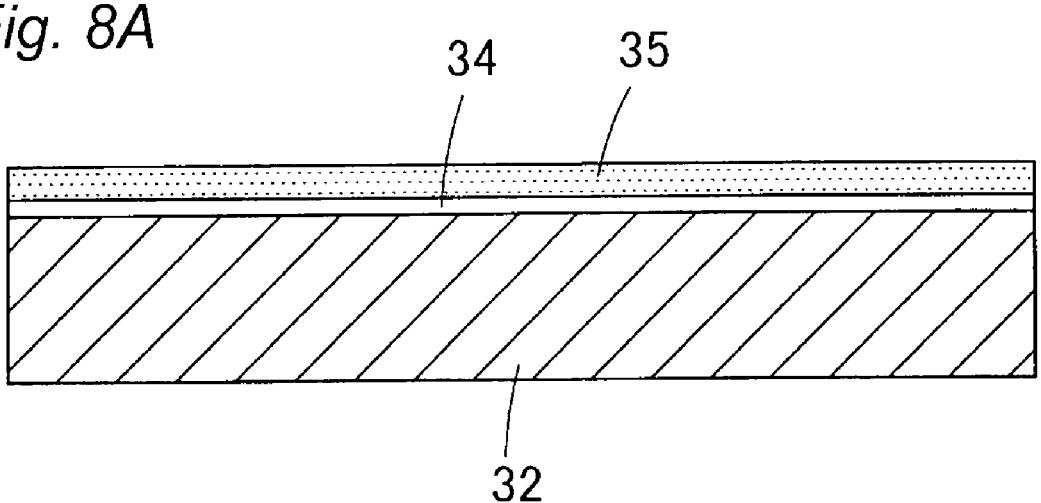
FIGS. 8A to 8C are schematic section views for illustrating a manufacturing process of the sensing device according to the example 2.
Figure 8B:
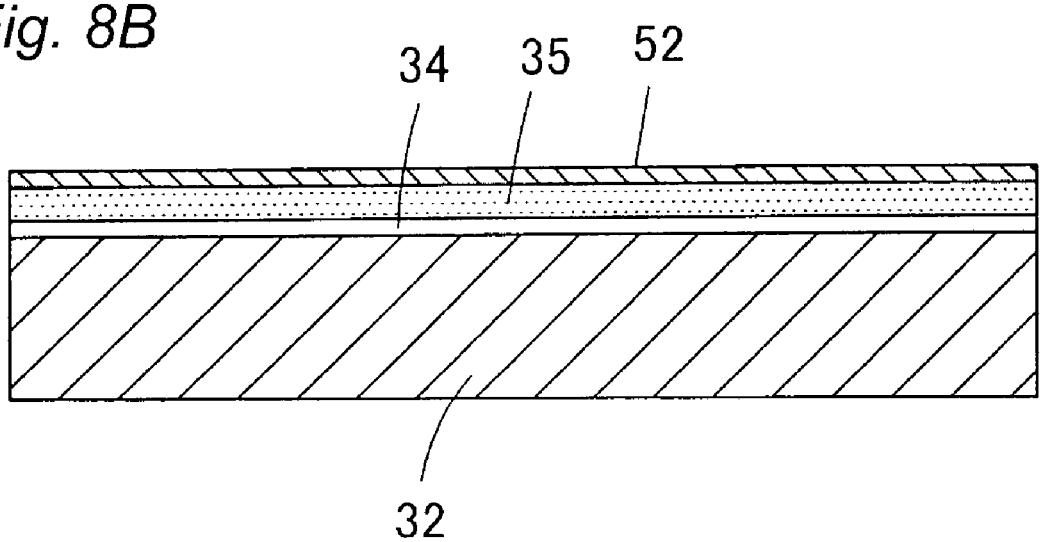
Figure 8C:
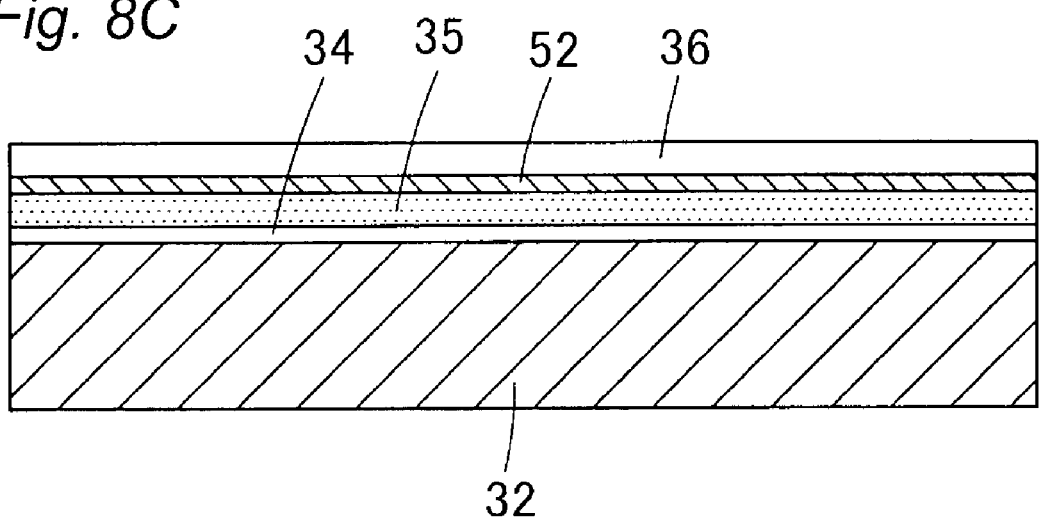

FIGS. 8A to 8C and FIGS. 9A to 9D are schematic section views for illustrating an example of a manufacturing process of the sensing device 51 of the example 2. FIG. 8A shows a state that the lower film 35 being made conductive is formed on the top of the substrate 32 by performing deposition of the insulating film 34, deposition of the lower film 35, doping of an impurity, formation of the anti-defect film 39, and thermal diffusion treatment of the impurity according to steps of FIG. 4A to FIG. 5B of the example 1, then the anti-defect film 39 on a top surface is removed. In the example 2, the etching stop layer 52 is then formed on the top of the lower film 35 (FIG. 8B). The etching stop layer 52 may be formed of a material being not etched by an etching method (including etchant and etching gas) used for etching the upper film 36, or may be formed of a material having an etching rate being extremely slow compared with an etching rate of the upper film 36 in the etching method used for etching the upper film 36. The anti-defect film 39 that was formed on the top of the lower film 35 may not be removed to be left, and may be used as the etching stop layer 52.

Figure 9A:
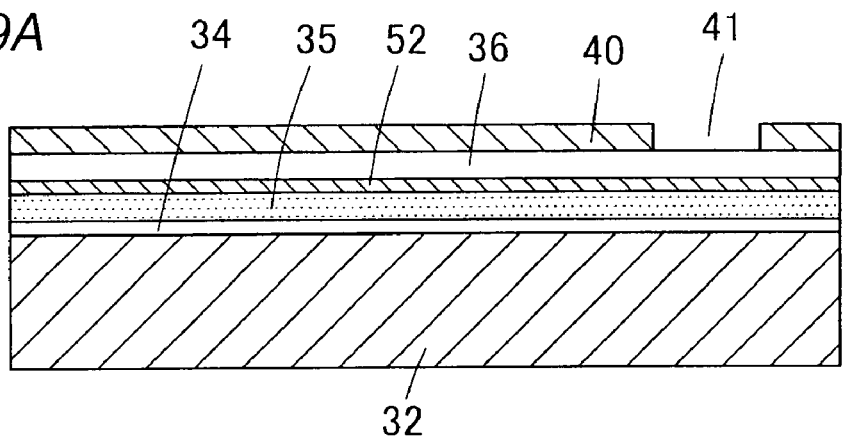
FIGS. 9A to 9D are schematic section views for illustrating the manufacturing process of the sensing device according to the example 2, showing steps after FIG. 8C.
Figure 9B:
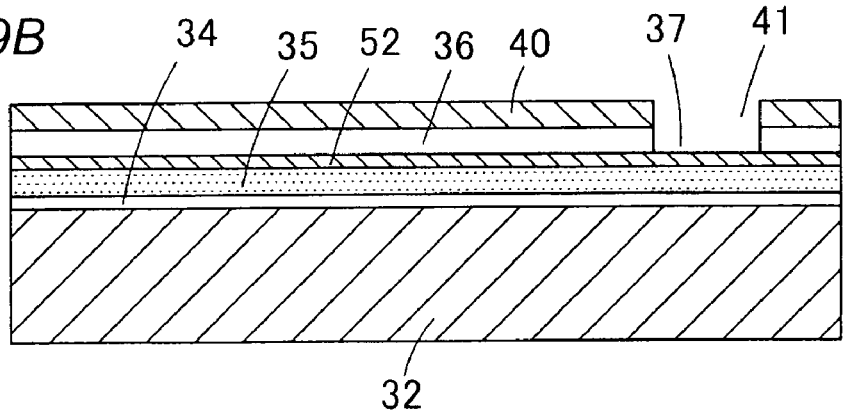
Figure 9C:
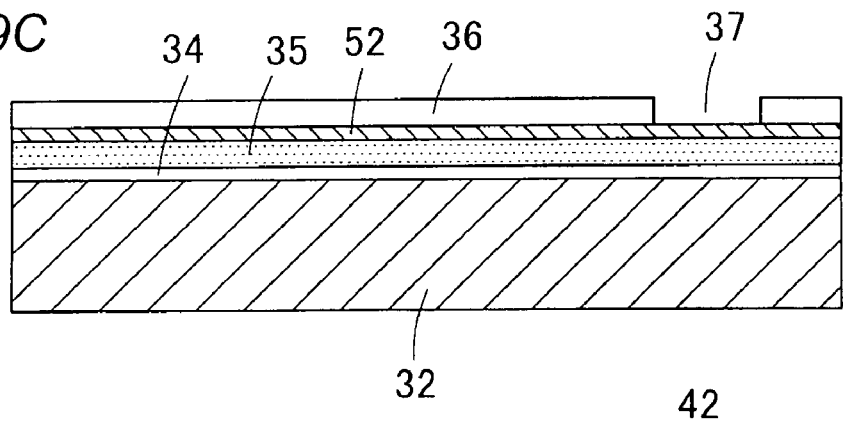
Figure 9D:
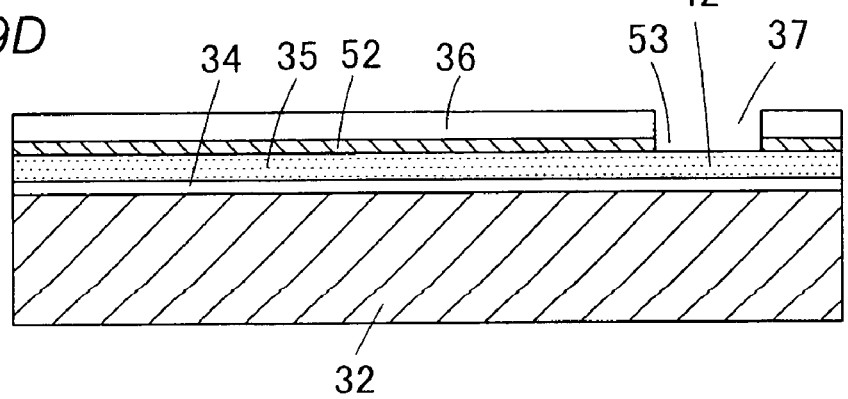

Next, the upper film 36 is deposited on a top of the etching stop layer 52 (FIG. 8C), then the top of the upper film 36 is covered by the resist mask 40 and then the opening area 41 is opened in the resist mask 40 (FIG. 9A). Furthermore, the upper film 36 is removed by etching from the opening area 41 of the resist mask 40 using an etchant or etching gas that etches the upper film 36 but does not etch the etching stop layer 52. For example, when the etching stop layer 52 is an oxide film, the upper film 36 is etched using a HF solution, or etched by gas plasma of a mixed gas of $CHF_3$ and $O_2$ or the like. As a result, while the opening 37 is opened in the upper film 36, since the etching stop layer 52 is not etched, when etching proceeds to a bottom of the upper film 36 and the etching stop layer 52 is exposed in the opening 37, etching is stopped (FIG. 9B). When etching is finished, the resist mask 40 is separated from the top of the upper film 36 (FIG. 9C).

In the example 2, since the etching stop layer 52 is provided between the lower film 35 and the upper film 36, when the upper film 36 is etched, etching is naturally stopped when it reaches the etching stop layer 52. Accordingly, etching time need not be controlled such that only the upper film 36 is etched unlike the example 1, consequently the upper film 36 can be easily and stably etched to form the opening 37.

Then, wet etching or dry etching is performed using an etchant or etching gas that etches the etching stop layer 52 but does not etch the lower film 35, thereby the etching stop layer 52 is selectively etched using the upper film 36 as a mask, so that the etching stop layer 52 in the opening 37 is removed, and the lower film 35 is exposed in the opening 37 to form the electrode leading portion 42. When the etching stop layer 52 is conductive, the etching stop layer 52 in the opening 37 may not be removed to be left, and in such a case, a step of FIG. 9D can be omitted. Then, the through-hole 33 is opened in the substrate 32, and unnecessary portions of the insulating film 34, lower film 35, etching stop layer 52, upper film 36 and the like are removed, thereby the sensing device 51 as shown in FIG. 7 is obtained.

Figure 10:
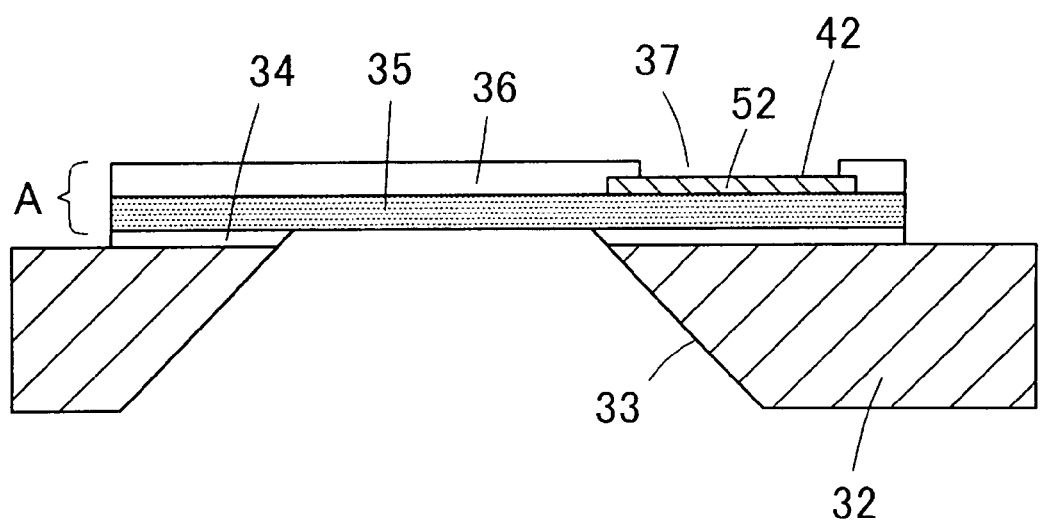
FIG. 10 is a schematic section view showing a sensing device according to a modification of the example 2.
Figure 11A:
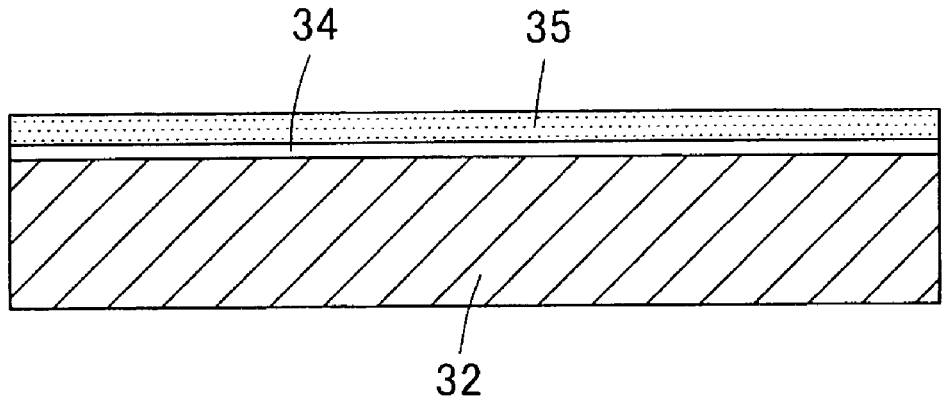
FIGS. 11A to 11C are schematic section views for illustrating a manufacturing process of the sensing device according to the modification of the example 2.
Figure 11B:
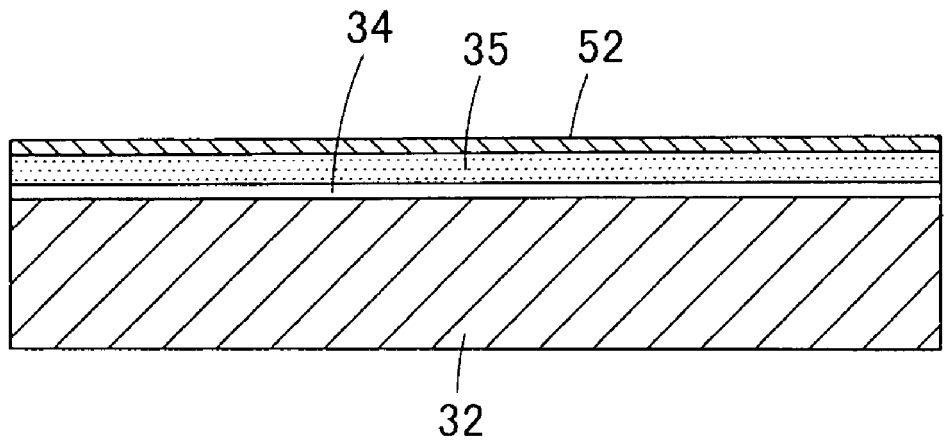
Figure 11C:
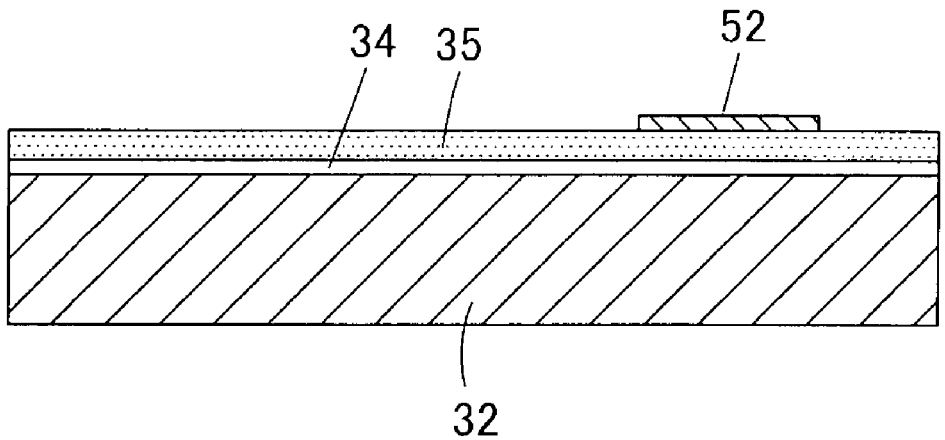
Figure 12A:
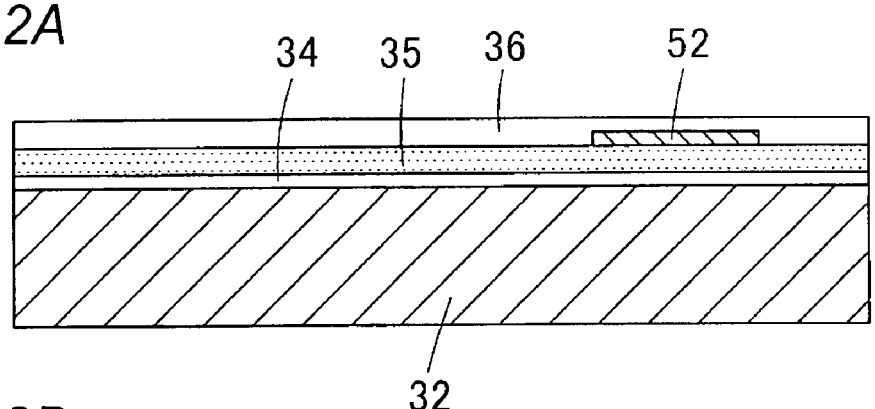
FIGS. 12A to 12D are schematic section views for illustrating the manufacturing process of the sensing device according to the modification of the example 2, showing steps after FIG. 11C.
Figure 12B:
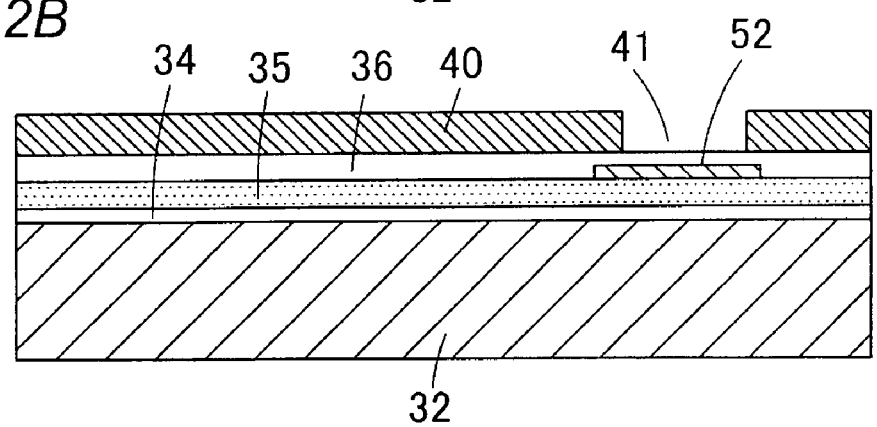
Figure 12C:
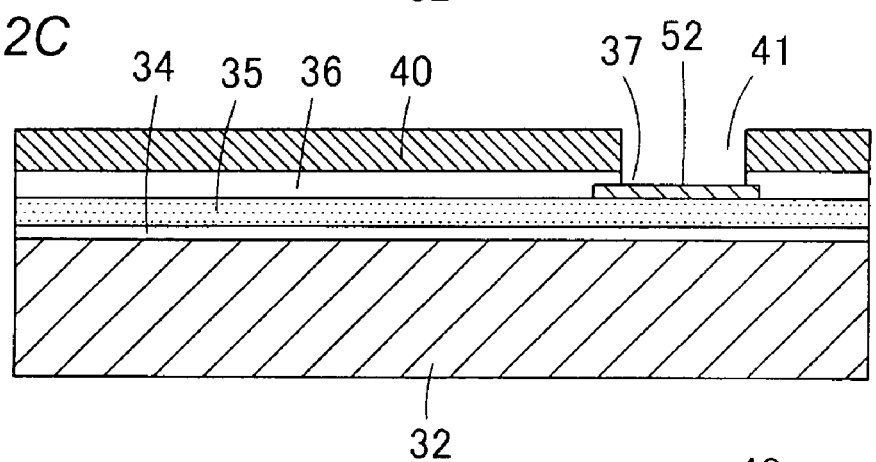
Figure 12D:
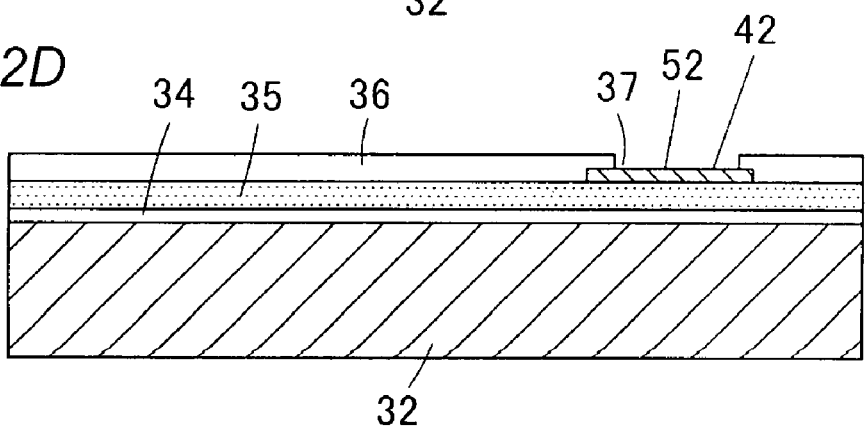

FIG. 10 shows a schematic section view of a sensing device 61 according to a modification of the example 2, and FIGS. 11A to 11C and FIGS. 12A to 12D show part of a manufacturing process of the device. While the etching stop layer 52 is left over the whole top of the lower film 35 in the example 2, the etching stop layer 52 is left only on a bottom of the opening 37 in the modification shown in FIG. 10. That is, as shown in FIGS. 11A and 11B, the etching stop layer 52 is formed over the whole top of the lower film 35 being made conductive, then while the etching stop layer 52 in a region to be the electrode leading portion 42 is left, the etching stop layer 52 in all other regions is removed using a photolithography technique (FIG. 11C). Then, the upper film 36 is deposited on the lower film 35 over the partially formed etching stop layer 52 (FIG. 12A), and then the sensing device 61 is fabricated in the same way as in the case of the example 2 (FIGS. 12B to 12D). However, in the modification, since a case that the etching stop layer 52 is formed of a conductive material is supposed, the etching stop layer 52 is left in the opening 37, however, when the etching stop layer 52 is not conductive, the etching stop layer 52 in the opening 37 can be finally removed.

Example 3

Figure 13:
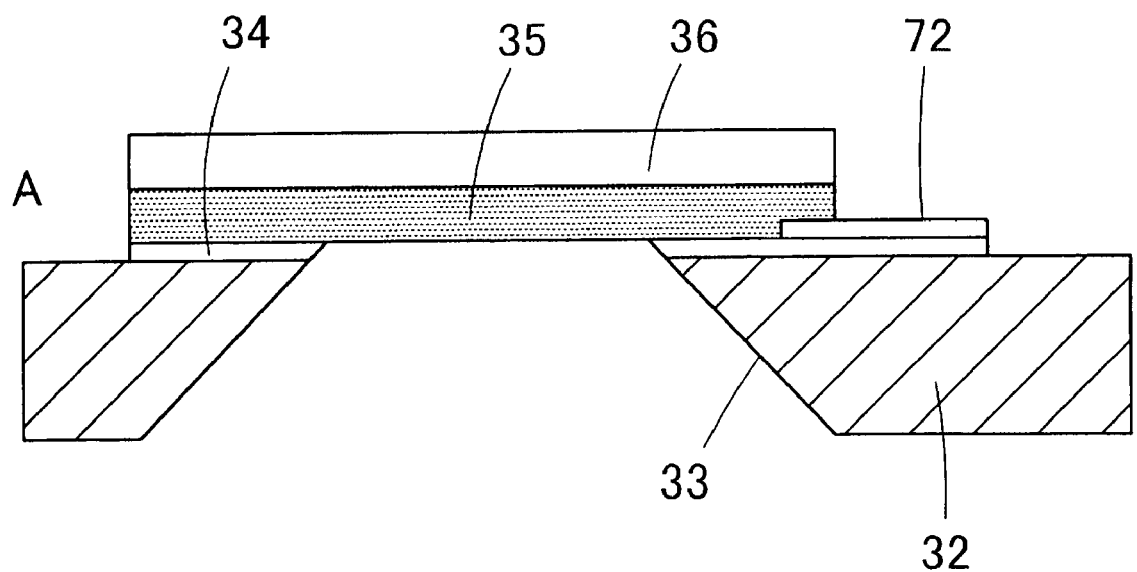
FIG. 13 is a schematic section view showing a sensing device according to example 3 of the invention.

FIG. 13 is a schematic section view showing example 3 of the invention, which shows a sensing device 71 having a thin film structure A according to an embodiment of the invention. In the sensing device 71 of the example 3, an electric wiring section 72 is led out from the thin film structure A, and an external circuit is connected to the electric wiring section 72 so that an electric signal from the thin film structure A can be drawn from the electric wiring section 72.

Figure 14A:
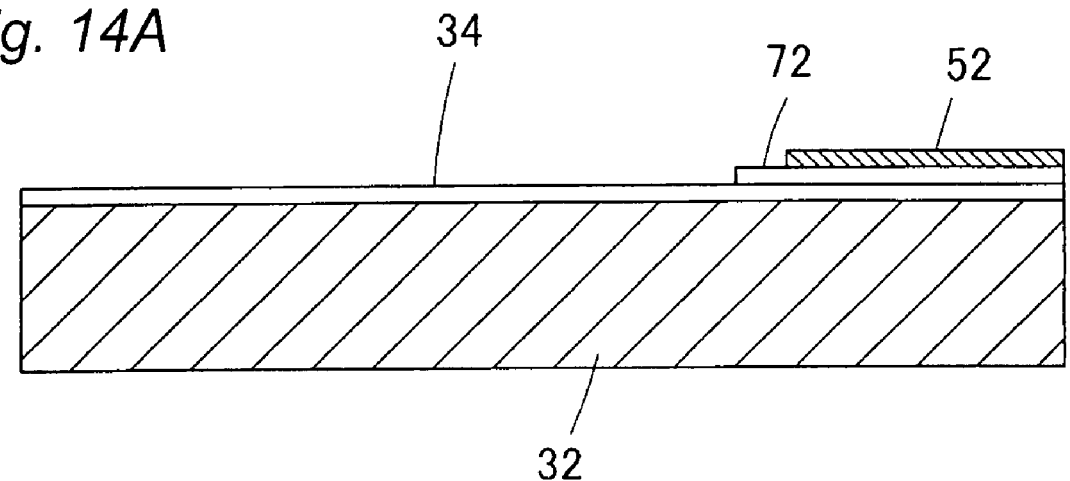
FIGS. 14A to 14C are schematic section views for illustrating a manufacturing process of the sensing device according to the example 3.
Figure 14B:
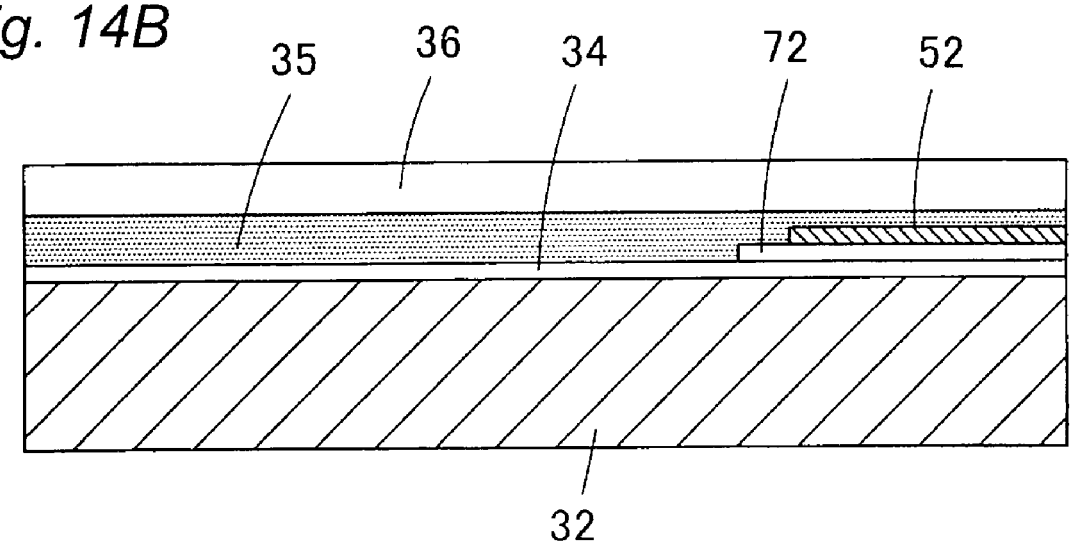

FIGS. 14A to 14C and FIGS. 15A to 15B are schematic section views for illustrating an example of a manufacturing process of the sensing device 71 of the example 3. In the example, the electric wiring section 72 and the etching stop layer 52 are formed on the insulating film 34 on the top of the substrate 32, then unnecessary portions of the electric wiring section 72 and the etching stop layer 52 are removed by etching (FIG. 14A). While the electric wiring section 72 may include any material as long as it is conductive, for example, a metal thin film or polysilicon being made conductive, a polysilicon being made conductive is desirably used in the light of a material to be proof against later heat treatment. Part of the electric wiring section 72 is provided in a region where the thin film structure A is formed, and the remainder is provided in a region outside the region where the thin film structure A is formed. The etching stop layer 52 is formed in a region outside the region where the thin film structure A is formed on a top of the electric wiring section 72. Then, the lower film 35 is deposited, and then made to be conductive by thermal diffusion of an impurity, and then the upper film 36 is deposited thereon (FIG. 14B).

Figure 14C:
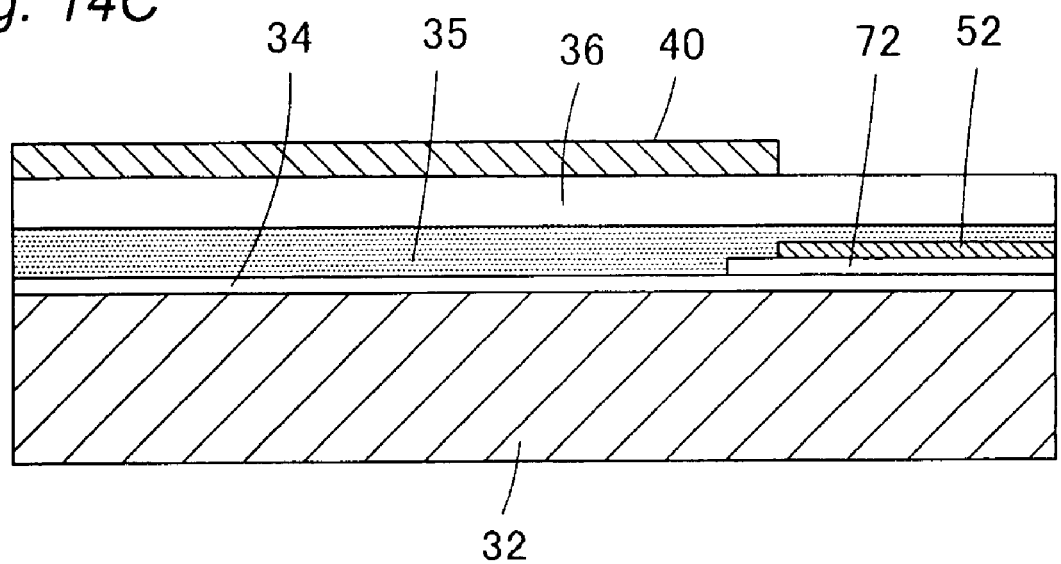
Figure 15A:
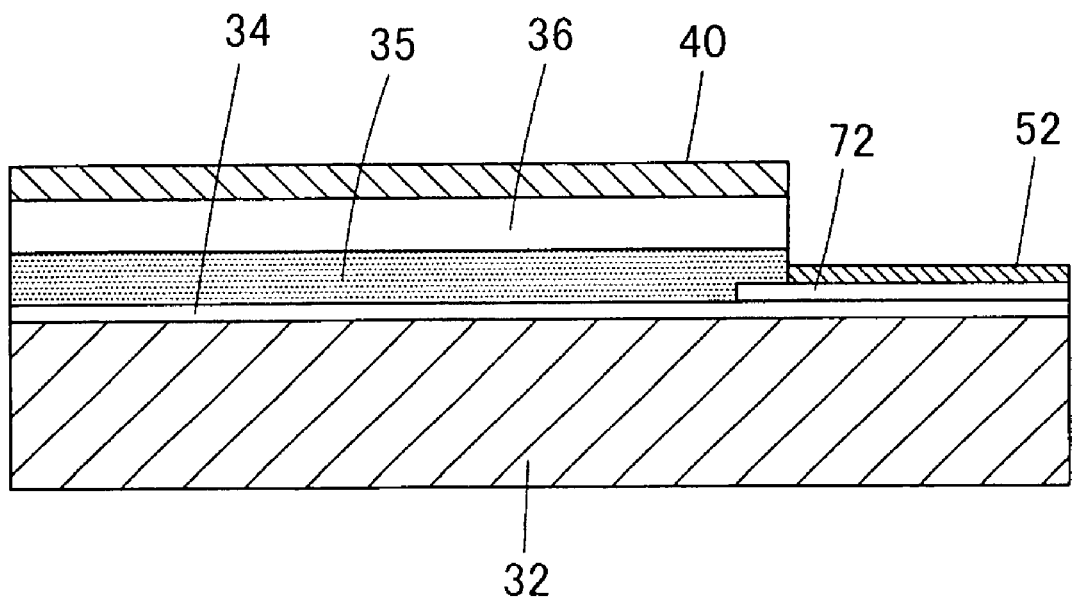
FIGS. 15A and 15B are schematic section views for illustrating the manufacturing process of the sensing device according to the example 3, showing steps after FIG. 14C.

Next, photoresist is coated on the top of the upper film 36 to cover the upper film 36 by the resist mask 40, and the resist mask 40 is removed in a region being opposed to the etching stop layer 52 (or the region where the electric wiring section 72 is exposed from the thin film structure A) (FIG. 14C). Then, the upper film 36 and lower film 35 exposed from the resist mask 40 is removed by etching using an etchant or etching gas that etches the upper film 36 and lower film 35 but does not etch the etching stop layer 52. For example, when the etching stop layer 52 is a layer of an oxide film, the films 36 and 35 are etched using a HF solution, or etched by gas plasma of a mixed gas of $CHF_3$ and $O_2$ or the like. As a result, part of the upper film 36 and lower film 35 is removed and thus the etching stop layer 52 is exposed (FIG. 15A).

Figure 15B:
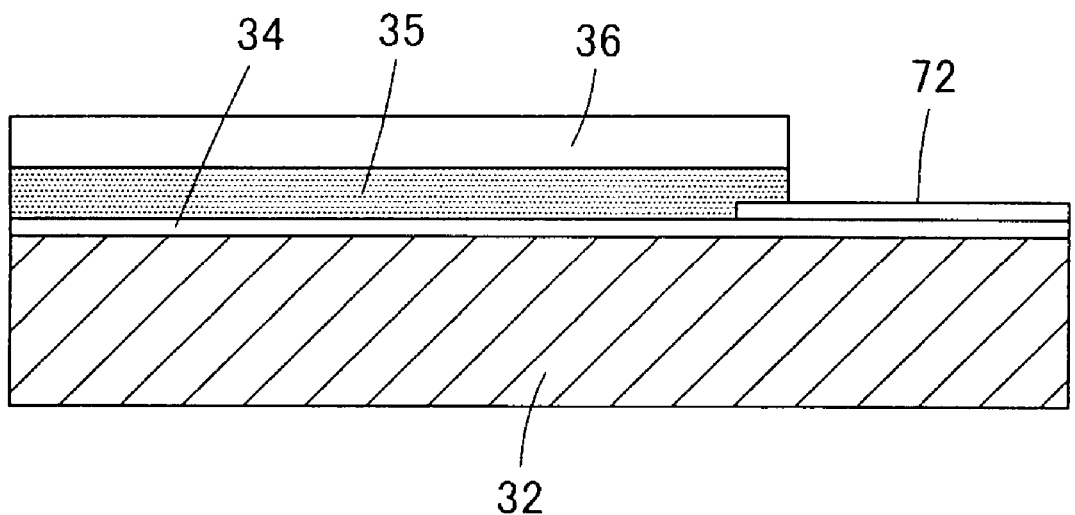

When etching is finished, the resist mask 40 is separated from the top of the upper film 36. Then, wet etching or dry etching is performed with the upper film 36 and lower film 35 as a mask using an etchant or etching gas that etches the etching stop layer 52 but does not etch the electric wiring section 72, so that the etching stop layer 52 is selectively removed by etching, and the electric wiring section 72 is exposed (FIG. 15B). In this way, part of the electric wiring section 72 is electrically contacted to the lower film 35, and other portions of the section 72 are exposed from the thin film structure A.

Finally, the through-hole 33 is opened in the substrate 32, and unnecessary portions of the insulating film 34, lower film 35, upper film 36 and the like are removed, thereby the sensing device 71 as shown in FIG. 13 is obtained.

Example 4

Figure 16:
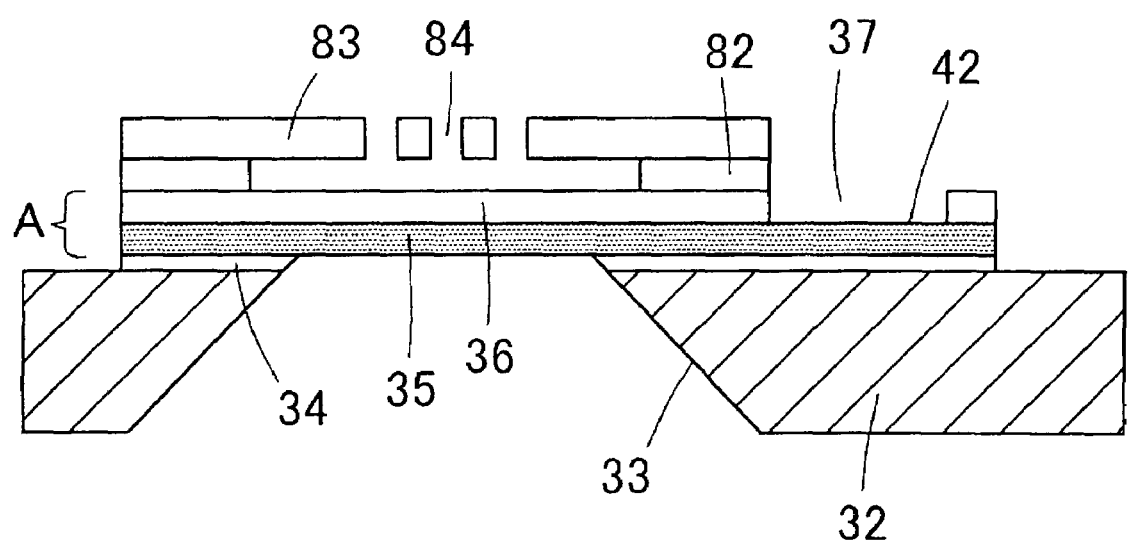
FIG. 16 is a schematic section view showing an oscillation sensor according to an embodiment of the invention.

FIG. 16 is a schematic section view showing an oscillation sensor 81 according to an embodiment of the invention. For example, the oscillation sensor 81 is used for a compact microphone. The oscillation sensor 81 is configured by using the sensing device according to an embodiment of the invention, for example, the sensing device 31 of the example 1, wherein a back plate 83 is provided on the thin film structure A via a spacer 82 including $SiO_2$, and a vent 84 is opened in the back plate 83. The back plate 83 is formed of metal, polysilicon being made conductive or the like, and conductive. The thin film structure A (lower film 35) and the back plate 83 form a sensing capacitor.

In the oscillation sensor 81, voice oscillation is received at a side of the back plate 83. When voice oscillation is propagated to the oscillation sensor 81, the voice oscillation is further propagated into the oscillation sensor 81 through the vent 84, and oscillates the thin film structure A. The thin film structure A oscillates in resonance with the voice oscillation, thereby capacitance between the back plate 83 and the thin film structure A is changed, therefore the voice oscillation can be picked up by measuring such change in capacitance by an external circuit.

In addition, in the oscillation sensor 81, since the thin film structure A is allowed to have small tensile stress, oscillation characteristics of the oscillation sensor 81 can be improved to improve measurement accuracy. Furthermore, since a surface (upper film 36) of the thin film structure A at a side being opposed to the back plate 83 is insulative or highly resistive, withstanding voltage characteristics of the oscillation sensor 81 are excellent. Moreover, since the upper film 36 also operates as a passivation film, there is no concern for current flow due to electrical conduction between the thin film structure A and the back plate 83 when the thin film structure A is contacted to the back plate 83.

Example 5

Figure 17:
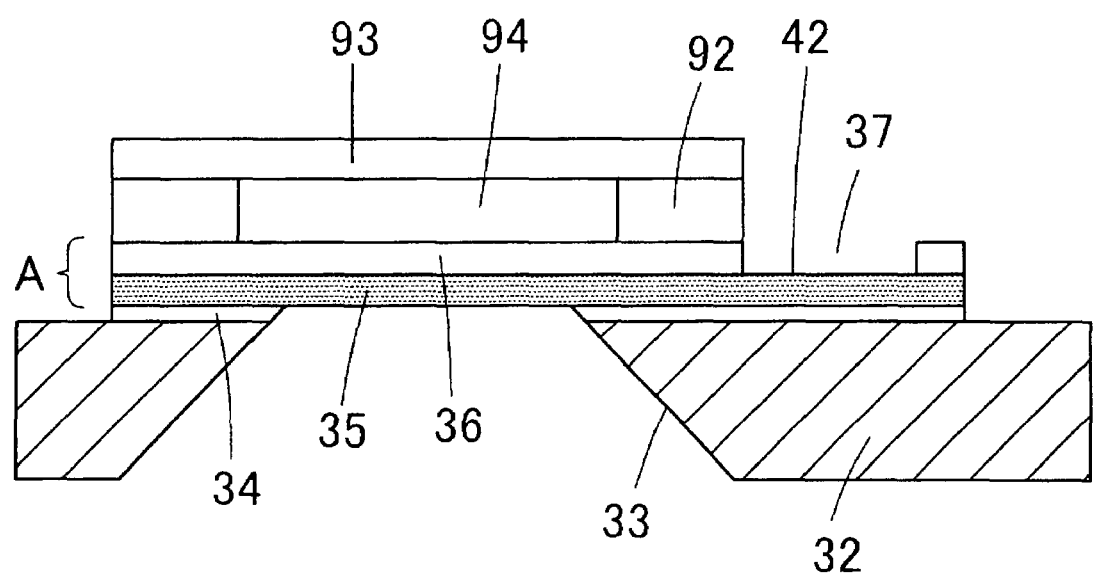
FIG. 17 is a schematic section view showing a pressure sensor according to an embodiment of the invention.

FIG. 17 is a schematic section view showing a pressure sensor 91 according to an embodiment of the invention. In the pressure sensor 91, a back plate 93 is provided on the thin film structure A via a spacer 92 including $SiO_2$, and an airtight chamber 94 being held at reference pressure is provided between the thin film structure A and the back plate 93. The back plate 93 is formed of metal, polysilicon being made conductive or the like, and conductive. The thin film structure A (lower film 35) and the back plate 93 form a sensing capacitor.

In pressure sensor 91, pressure to be sensed is received at a bottom of the thin film structure A, and deflection of the thin film structure A is changed depending on difference between pressure on the bottom of the thin film structure A and pressure within the airtight chamber 94 so that capacitance between the back plate 93 and the thin film structure A is changed, and the pressure can be measured by measuring such change in capacitance by an external circuit.

In addition, in the pressure sensor 91, since the thin film structure A is allowed to have small tensile stress, the pressure sensor 91 is not previously deflected due to internal stress, and measurement accuracy of the pressure sensor 91 can be improved. Furthermore, since a surface (upper film 36) of the thin film structure A at a side being opposed to the back plate 93 is insulative or highly resistive, withstanding voltage characteristics of the pressure sensor 91 are excellent. Moreover, since the upper film 36 also operates as a passivation film, there is no concern for current flow due to electrical conduction between the thin film structure A and the back plate 93 when the thin film structure A is contacted to the back plate 93.

Example 6

Figure 18:
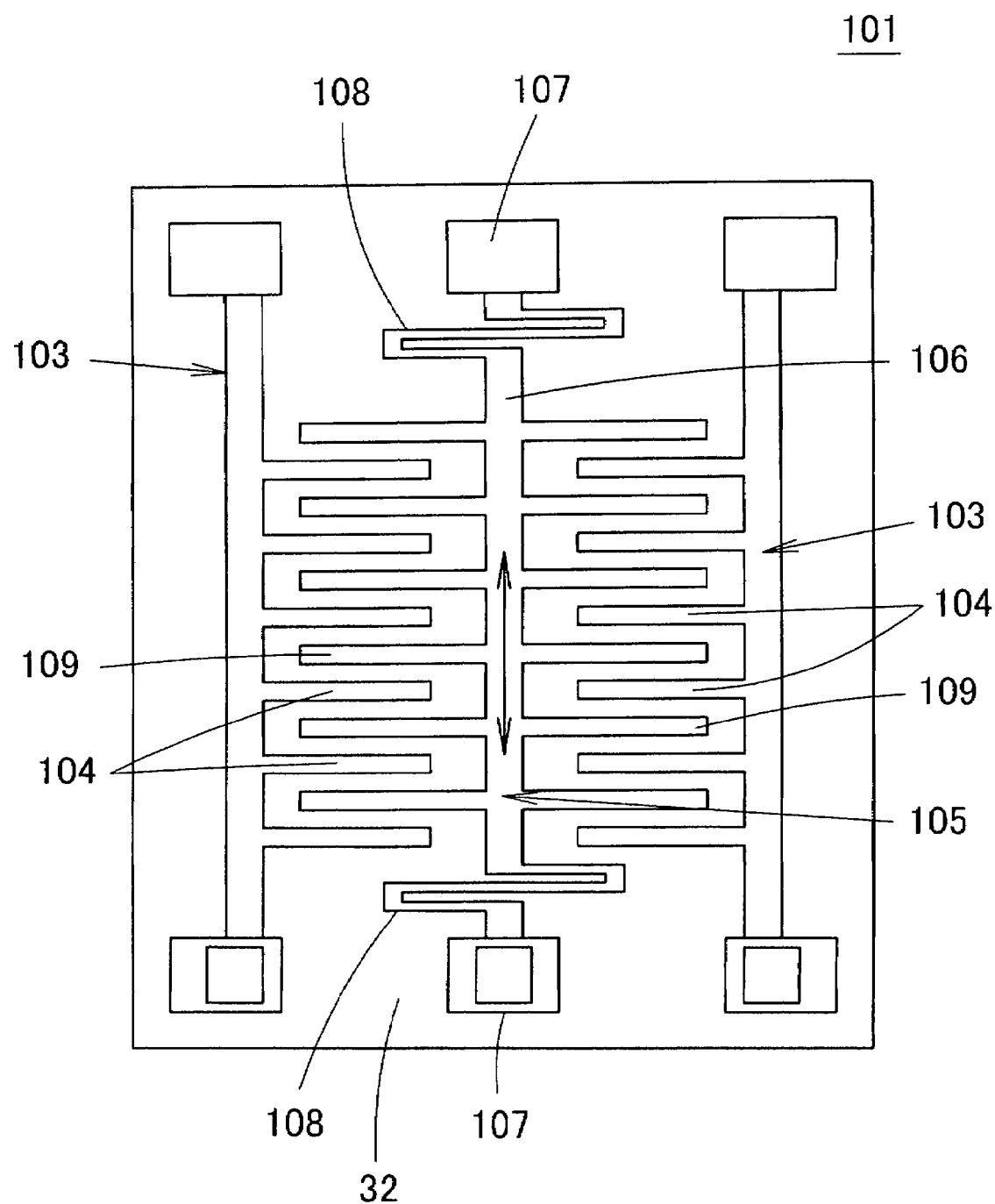
FIG. 18 is a plane view showing a configuration of an acceleration sensor in a capacitance type.

FIG. 18 is a plane view showing a configuration of an acceleration sensor 101 in a capacitance type. In the acceleration sensor 101, stationary electrodes 103 and a movable electrode 105 are formed on a top of the substrate 32. The stationary electrodes 103 and the movable electrode 105 are formed by the thin film structure of an embodiment of the invention.

The movable electrode 105 is disposed in a central portion of the top of the substrate 32, and fixed to the top of the substrate 32 at both ends. A central portion of the movable electrode 105 is a comblike, movable portion 106, and stationary portions 107 and both end of the movable portion 106 of the movable electrode 105 are connected to each other via spring suspension portions 108 being easily deformed. Comblike electrodes 109 are extended to both sides at a constant pitch from the movable portion 106 of the movable electrode 105.

The stationary electrodes 103 are disposed at both sides of the movable electrode 105 in a bookend manner on the top of the substrate 32. Comblike electrodes 104 are extended to the movable electrode 105 at a constant pitch from each of the stationary electrodes 103. The comblike electrodes 109 of the movable electrode 105 and the comblike electrodes 104 of the stationary electrodes 103 are alternately disposed in a manner of being engaged with each other.

In the acceleration sensor 101, when the sensor senses acceleration in a direction of an arrow shown in FIG. 18, the movable portion 106 of the movable electrode 105 is displaced in the arrow direction, so that capacitance between the comblike electrodes 104 of the stationary electrodes 103 and the comblike electrodes 109 of the movable electrode 105 is changed. Since displacement of the movable portion 106 is increased with increase in acceleration, and capacitance between the comblike electrodes 104 and 109 is correspondingly changed, acceleration can be measured by measuring such change in capacitance.

Again in the acceleration sensor 101 having such a configuration, when deflection or the like due to internal stress exists in the stationary electrodes 103 or the movable electrode 105 (particularly, movable electrode 105), sensing accuracy is affected thereby, however, according to the thin film structure of an embodiment of the invention, since the structure is allowed to have small tensile stress, sensing accuracy or reliability can be improved.

Example 7

Figure 19:
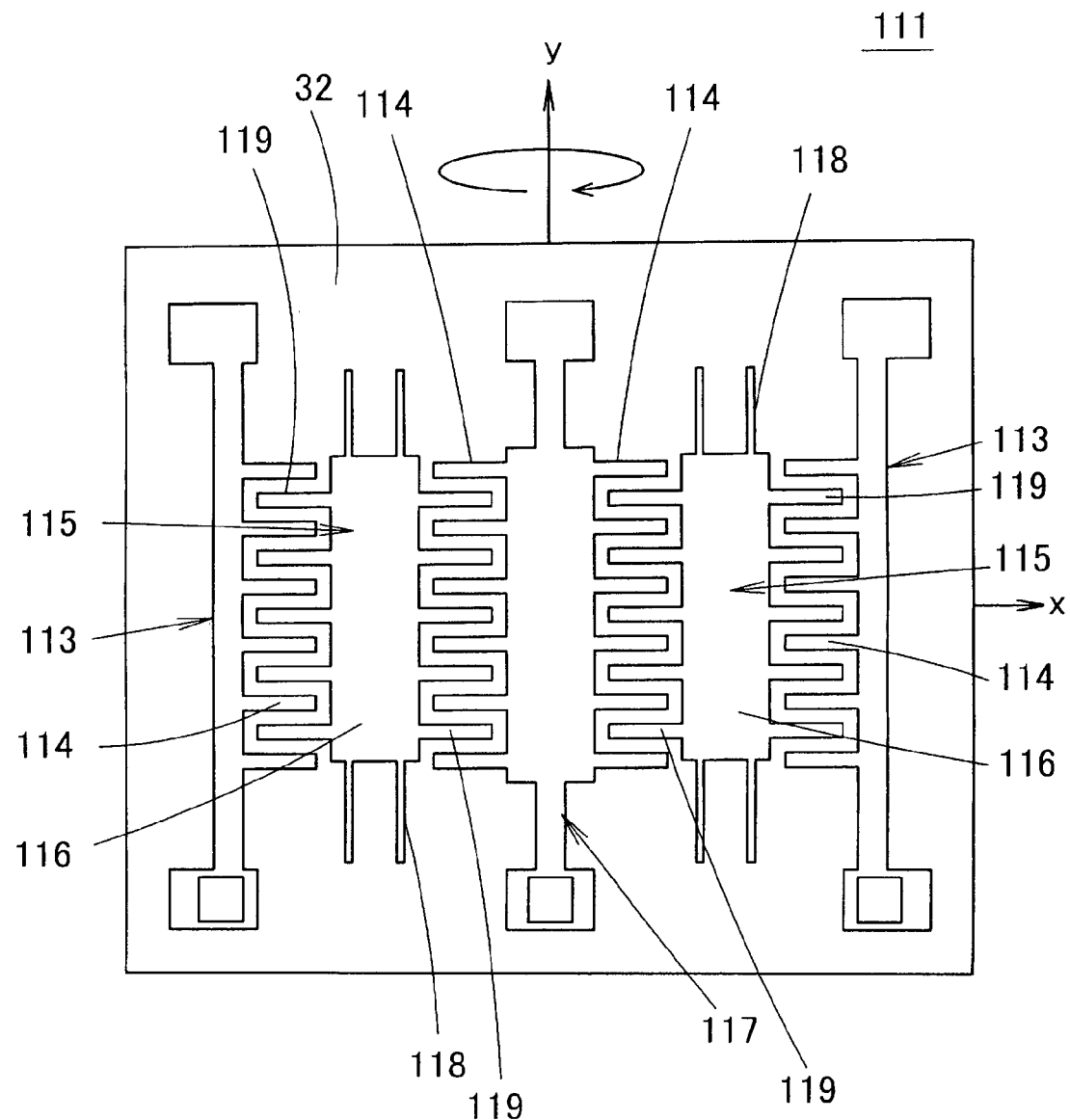
FIG. 19 is a plane view showing a configuration of a gyro sensor in a capacitance type.

FIG. 19 is a plane view showing a configuration of a gyro sensor 111 in a capacitance type. In the gyro sensor 111, a comblike, stationary drive electrode 117 is provided in a central portion of a top of the substrate 32, and comblike electrodes 114 are extended to both sides from the stationary drive electrode 117 at a constant pitch. Comblike stationary electrodes 113 are provided at both sides of the stationary drive electrode 117 with movable electrodes 115 between the electrodes 113 and 117, and comblike electrodes 114 are extended also from the respective stationary electrode 113 at a constant pitch.

Each of the movable electrodes 115 disposed between the stationary drive electrode 117 and the sensing electrodes 113 is formed of polysilicon being made conductive, and an oscillating portion 116 of the movable electrode 115 is held by the substrate 32 via two narrow beams 118 at both ends. The oscillating portion 116 is in a comblike shape, and comblike electrodes 119 are extended from the portion to both sides at a constant pitch. The comblike electrodes 119 of the movable electrodes 115 and the comblike electrodes 114 of the stationary electrodes 113 are alternately disposed in a manner of being engaged with each other. The stationary drive electrode 117, the stationary sensing electrodes 113, and the movable electrodes 115 are formed by the thin film structure of an embodiment of the invention.

In the gyro sensor 111, an oscillation drive signal is applied between the stationary drive electrode 117 and both comblike electrodes 114 and 119 of diaphragms 116 at both sides of the electrode 117, so that right and left diaphragms 116 are oscillated in opposite phases to each other, and with the same amplitude in an x axis direction. When the gyro sensor 111 is rotated about a y axis direction in this state, Coriolis' force is induced in both the diaphragms 116 in opposite directions to each other in a z axis direction being perpendicular to x and y axis directions. A direction and amplitude of oscillation in the z axis direction of each of the diaphragms 116 due to the Coriolis' force are detected as change in capacitance between the stationary sensing electrodes 113 and the movable electrodes 115, thereby angular velocity induced in the gyro sensor 111 can be detected.

Again in the gyro sensor 111 having such a configuration, when deflection or the like due to internal stress exists in the stationary drive electrode 117, stationary sensing electrodes 113, or the movable electrode 115 (particularly, movable electrodes 115), sensing accuracy is affected thereby, however, according to the thin film structure of an embodiment of the invention, since the structure is allowed to have small tensile stress, sensing accuracy or reliability can be improved.

What is claimed is:

1. A method for forming a thin film structure, which includes a lower film and an upper film, on a substrate, comprising:
    a step of forming the lower film that includes a polysilicon film on the substrate,
    a step of making the lower film to be conductive by doping an impurity into the lower film and thermally diffusing the impurity,
    a step of forming the upper film that includes a second polysilicon film on the lower film, the upper film being nonconductive and having a first tensile stress in approximately a same level as a compressive stress of the lower film, and
    a step of separating the thin film structure from the substrate by a first etching, leaving at least a part of a periphery of the thin film structure held by the substrate,
    wherein the thin film structure as a whole is adjusted to have a final tensile stress, and
    wherein after the impurity is doped into the lower film, an anti-defect film is formed on a top of the lower film before the impurity is thermally diffused.

2. The method for forming the thin film structure, according to claim 1:
    wherein after the upper film is formed on the anti-defect film, a portion of the upper film is removed by a second etching with the anti-defect film as an etching stop layer, thereby a part of the lower film is electrically exposed to the upper film.

* * * * *